(12) United States Patent
Chiu

(10) Patent No.: US 8,292,562 B2
(45) Date of Patent: Oct. 23, 2012

(54) FASTENER AND FIXING DEVICE AND ELECTRONIC DEVICE USING THE SAME

(75) Inventor: Hung-Nien Chiu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 346 days.

(21) Appl. No.: 12/820,082

(22) Filed: Jun. 21, 2010

(65) Prior Publication Data

US 2011/0228451 A1   Sep. 22, 2011

(30) Foreign Application Priority Data

Mar. 16, 2010   (TW) .............................. 99107519 A

(51) Int. Cl.
  *F16B 21/18*   (2006.01)
(52) U.S. Cl. ....................................... 411/353; 411/107

(58) Field of Classification Search .................. 411/107, 411/148, 146, 353
See application file for complete search history.

(56) References Cited

U.S. PATENT DOCUMENTS

| | | | | |
|---|---|---|---|---|
| 3,505,921 A | * | 4/1970 | Wigam | 411/34 |
| 5,129,710 A | * | 7/1992 | Knowles | 301/35.628 |
| 5,871,319 A | * | 2/1999 | Schneider | 411/107 |
| 6,786,691 B2 | * | 9/2004 | Alden, III | 411/371.2 |
| 7,641,431 B2 | * | 1/2010 | Luo et al. | 411/353 |
| 2003/0175091 A1 | * | 9/2003 | Aukzemas et al. | 411/107 |

* cited by examiner

*Primary Examiner* — Gary Estremsky
(74) *Attorney, Agent, or Firm* — Altis Law Group, Inc.

(57) ABSTRACT

An exemplary fastener includes a head, a shank extending downwardly from a bottom of the head, and a protruding flange extending outwardly from an outer surface of the shank at a position adjacent to the head. A portion of the shank between the head and the protruding flange is formed a neck. An outer diameter of the protruding flange is varying along an axial direction of the shank.

9 Claims, 9 Drawing Sheets

FASTENER AND FIXING DEVICE AND ELECTRONIC DEVICE USING THE SAME

BACKGROUND

1. Technical Field

The present disclosure relates to a fastener for assembling two bodies together, and a fixing device and an electronic device using the fastener.

2. Description of Related Art

With the continuing development of electronics technology, electronic packages, such as central processing unit (CPUs), are more powerful than ever before. Such kinds of electronic components correspondingly generate large amounts of heat in operation, and the heat needs to be promptly dissipated to ensure continuing normal operation. A thermal module is usually mounted on the electronic component for dissipating heat, and fasteners are needed for securing the thermal module onto the electronic component. Generally each fastener includes a bolt defining an annular groove near the bottom, a spring disposed around the top of the bolt, and a ring that can be snapped into the groove. After the bolts extend through the thermal module, the rings expand radially and outwardly to snap in the grooves of the bolts. Thereby, the bolts are pre-assembled to the thermal module.

However, during the pre-assembling process, there is no mechanism formed in the bolts which can reliably ensure the snapping of the rings into the grooves. The rings may be mistakenly mounted to ends of the bolts if the rings are not properly aligned with the grooves. When this erroneous mounting happens, the rings may drop from the bolts during transportation of the pre-assembled thermal module. In addition, even when the rings are correctly mounted, after the thermal module is assembled to the electronic component, the rings are no longer needed. The rings are made of metal with good resiliency, and the cost of the thermal module is increased by the need for using the rings.

It is thus desirable to provide a fastener which can overcome the described limitations.

DETAILED DESCRIPTION

Figure 1:
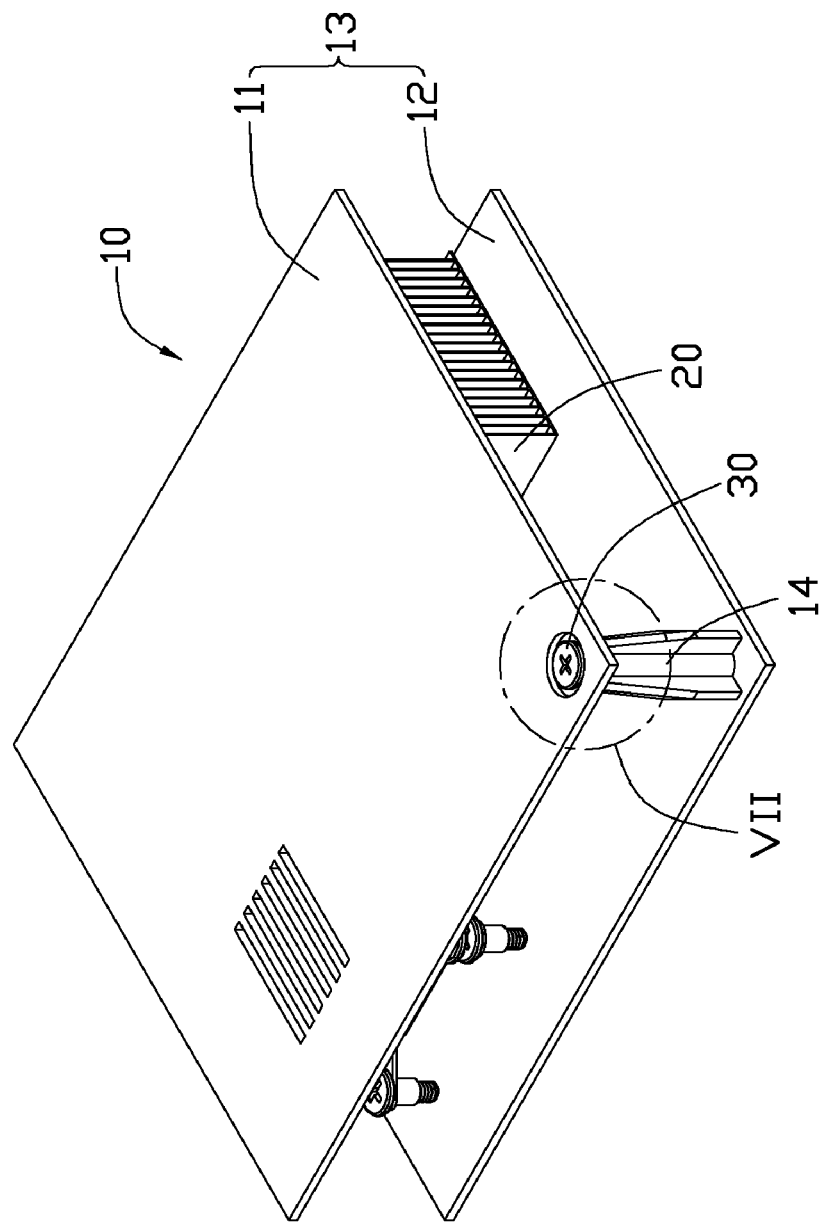
FIG. 1 is an assembled view of an electronic device according to an exemplary embodiment of the present disclosure.

Reference will now be made to the drawing figures to describe in detail various embodiments of the present fastener and fixing device and electronic device using the fastener.

Figure 2:
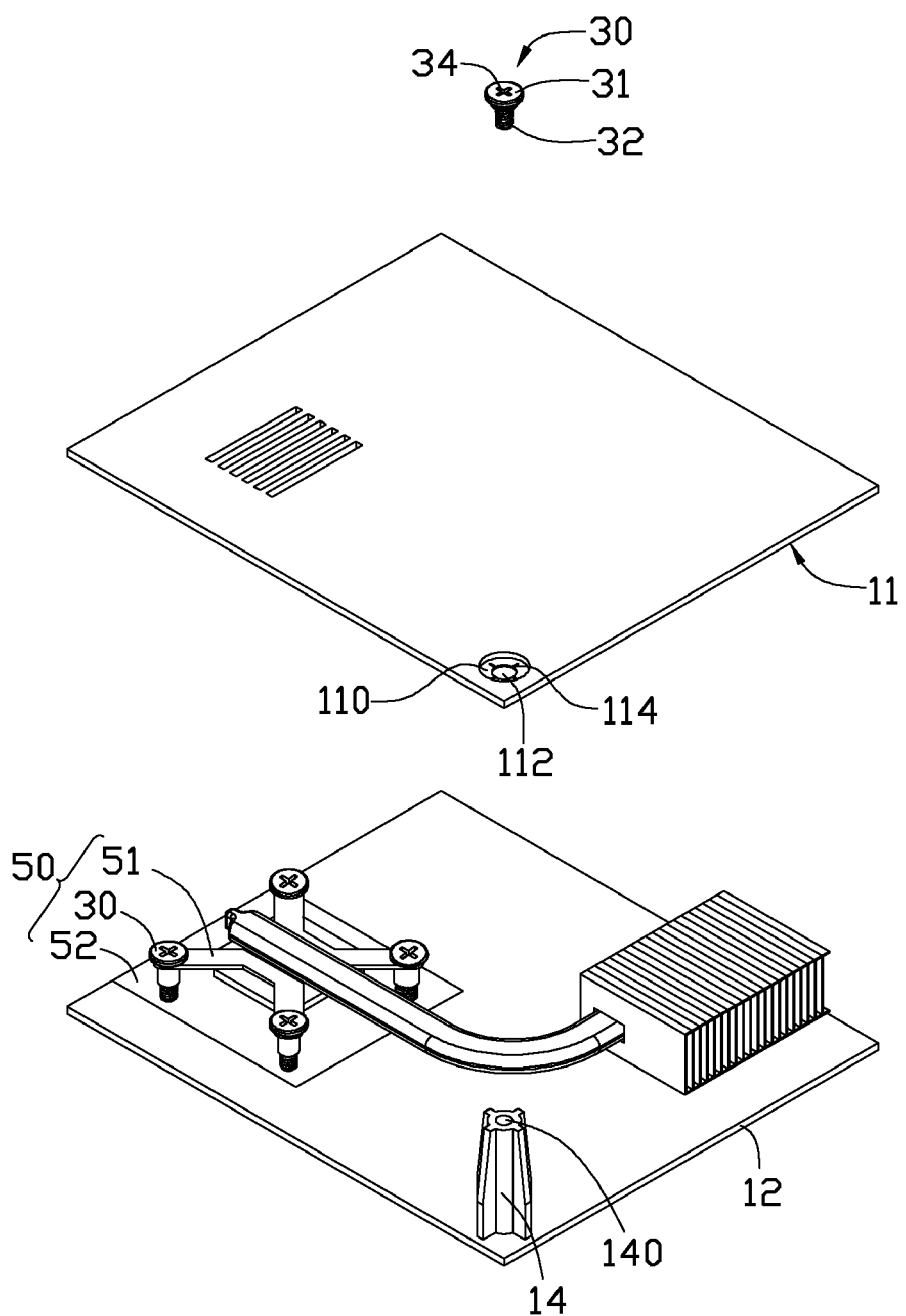
FIG. 2 is an exploded view of the electronic device of FIG. 1.

FIGS. 1 and 2 schematically show an electronic device 10 according to an exemplary embodiment. The electronic device 10 includes a casing 13, a heat dissipation device 20 received in the casing 13, and a fixing device 50 for securing the heat dissipation device 20 in the casing 13.

The casing 13 includes a rectangular top wall 11, a bottom wall 12 parallel to and spaced from the top wall 10, and a fastener 30. A fixing pole 14 extends upwardly from a corner of the bottom wall 12 to the top wall 11. An axial screw hole 140 is defined in a center of the fixing pole 14 along an axial direction thereof. A plurality of screw threads is formed on an inner surface of the fixing pole 14 around the screw hole 140. The top wall 11 defines a circular recess at a corner thereof, corresponding to the fixing pole 14 of the bottom wall 12. A portion of the top wall 11 at the bottom of the circular recess defines a mounting plate 110. The mounting plate 110 has a thickness smaller than that of other portions of the top wall 11. The mounting plate 110 defines a mounting hole 112 in a center thereof, and a plurality of splits 114 extending radially from a periphery of the mounting hole 112. Each of the splits 114 communicates with the mounting hole 112.

Figure 3:
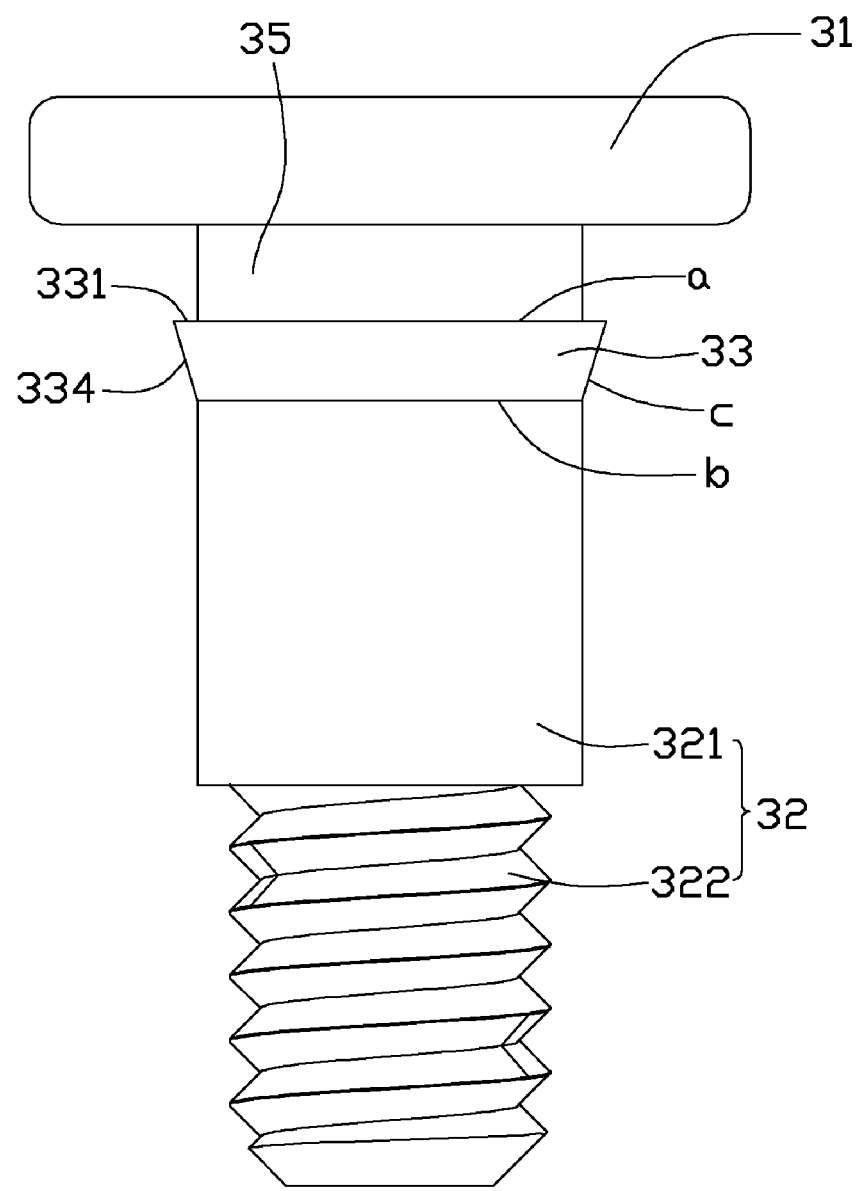
FIG. 3 is an enlarged, front plan view of a fastener of the electronic device of FIG. 2.

Referring also to FIG. 3, the fastener 30 resembles a standard screw type fastener, except the fastener 30 additionally includes an annular protruding flange 33. In detail, the fastener 30 includes a head 31, a shank 32, and the protruding flange 33 extending radially and outwards from an outer surface of the shank 32. The head 31 has a circular plate configuration. A cross-like slot 34 is defined in the head 31 for fittingly receiving a screwdriver (not shown), so that the fastener 30 can be manipulated. An outer diameter of the head 31 is larger than a diameter of the mounting hole 112, but smaller than a diameter of the recess. A lower portion of the shank 32 is threaded, and the remainder of the shank 32 is smooth. In particular, the shank 32 includes a smooth shaft portion 321 connected with the head 31, and a threaded engaging portion 322 farthest away from the head 31. A diameter of the shaft portion 321 is smaller than the diameter of the mounting hole 112. The engaging portion 322 extends coaxially from a bottom of the shaft portion 321, and has a diameter smaller than that of the shaft portion 321. The shaft portion 321 has a smooth outer cylindrical surface. The engaging portion 322 forms a plurality of screw threads at an outer cylindrical surface thereof.

The protruding flange 33 is circumferentially formed on the shaft portion 321 of the shank 32 at a position whereby a space exists between the protruding flange 33 and the head 31. The part of the shaft portion 321 at the space defines a neck 35. The protruding flange 33 includes an annular top surface 331 perpendicular to the outer surface of the shaft portion 321, and a tapered annular side surface 334 extending downwardly and slantwise from an outer periphery of the top surface 331 to connect with the outer surface of the shaft portion 321. The top surface 331 of the protruding flange 33 is parallel to and spaced from the head 31, thereby defining the neck 35 of the shaft portion 321. An axial length of the neck 35 is slightly greater than the thickness of the mounting plate 110.

The outer diameter of the protruding flange 33 gradually decreases along an axial direction of the shank 32 from the top surface 331 downward. Thus, the largest outer diameter of the protruding flange 33 is located at the topmost part thereof, and the smallest outer diameter of the protruding flange 33 is located at the bottommost part thereof. The largest outer diameter of the protruding flange 33 is larger than the diameter of the mounting hole 112, and the smallest outer diameter of the protruding flange 33 is substantially equal to the diameter of the shaft portion 321. As shown in FIG. 3, when the fastener 30 is oriented vertically and viewed side-on, a projection of the protruding flange 33 is an isosceles trapezoid. More particularly, a projection of the top surface 331 is an upper baseline "a", a projection of the side surface 334 is a pair of symmetrically opposite waistlines "c", and a projection of the bottom of the side surface 334 is a lower baseline "b".

Due to the largest outer diameter of the protruding flange 33 being larger than the diameter of the mounting hole 112, when the fastener 30 is oriented vertically with the shaft portion 321 coaxial with the mounting hole 112, the protruding flange 33 cannot pass through the mounting hole 112. However, because the outer diameter of the protruding flange 33 is different along the axial direction of the shank 32, when the fastener 30 is extended through the hole 112 at a predetermined angle with respect to a central axis of the mounting hole 112, the protruding flange 33 can pass through the mounting hole 112.

Figure 4:
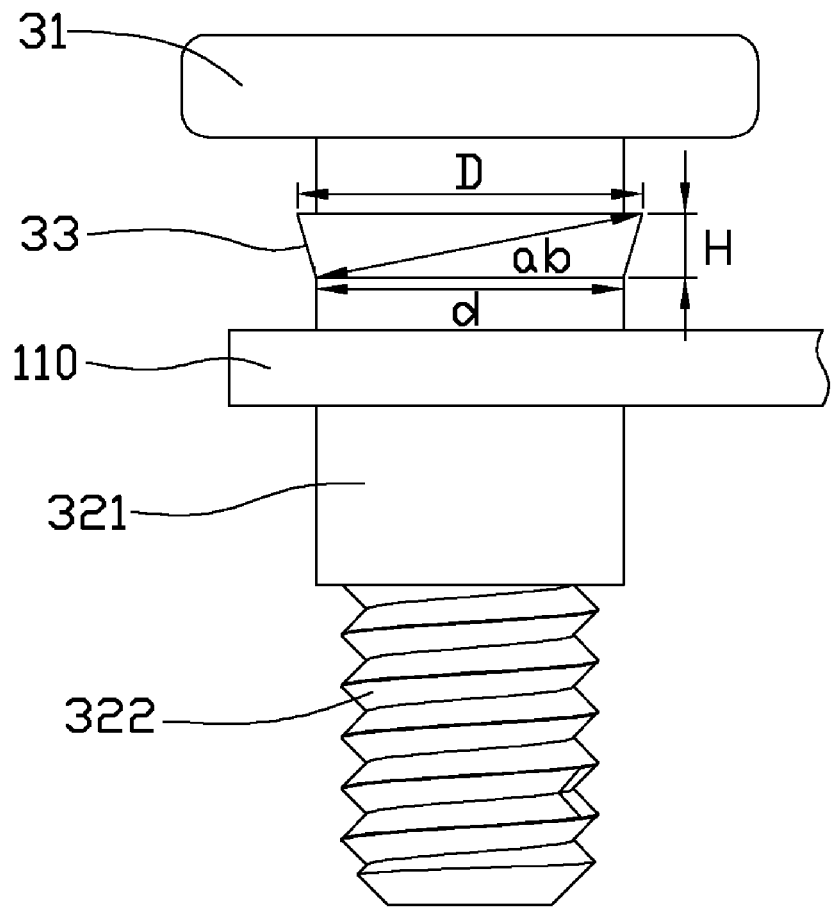
FIGS. 4-6 schematically show a pre-assembly process of the fastener of the electronic device.
Figure 5:
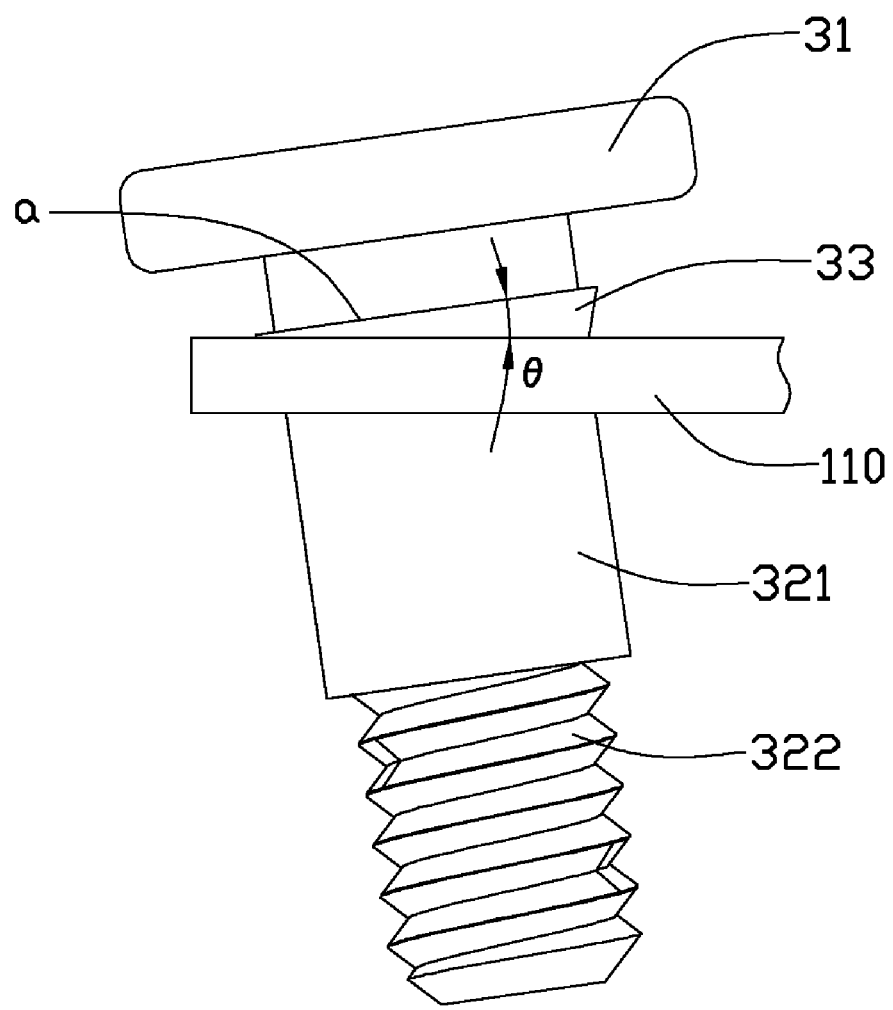

Referring to FIG. 4, to insert the fastener 30 through the mounting hole 112, the following steps are performed. Firstly, the fastener 30 is partially extended through the mounting hole 112 until the protruding flange 33 abuts against the mounting plate 110 at the top of the mounting hole 112. Detailedly, since the diameter of the shaft portion 321 is smaller than the diameter of the mounting hole 112, the engaging portion 322 and the bottom end of the shaft portion 321 can sequentially pass through the mounting hole 112 easily. Referring to FIG. 5, the fastener 30 is then inclined at the predetermined angle θ. In this position, the largest dimension of the protruding flange 33 along a plane parallel to radial directions of the mounting hole 112 is equal to a length of a diagonal line ab (see FIG. 4) of the isosceles trapezoidal projection of the protruding flange 33.

Figure 6:
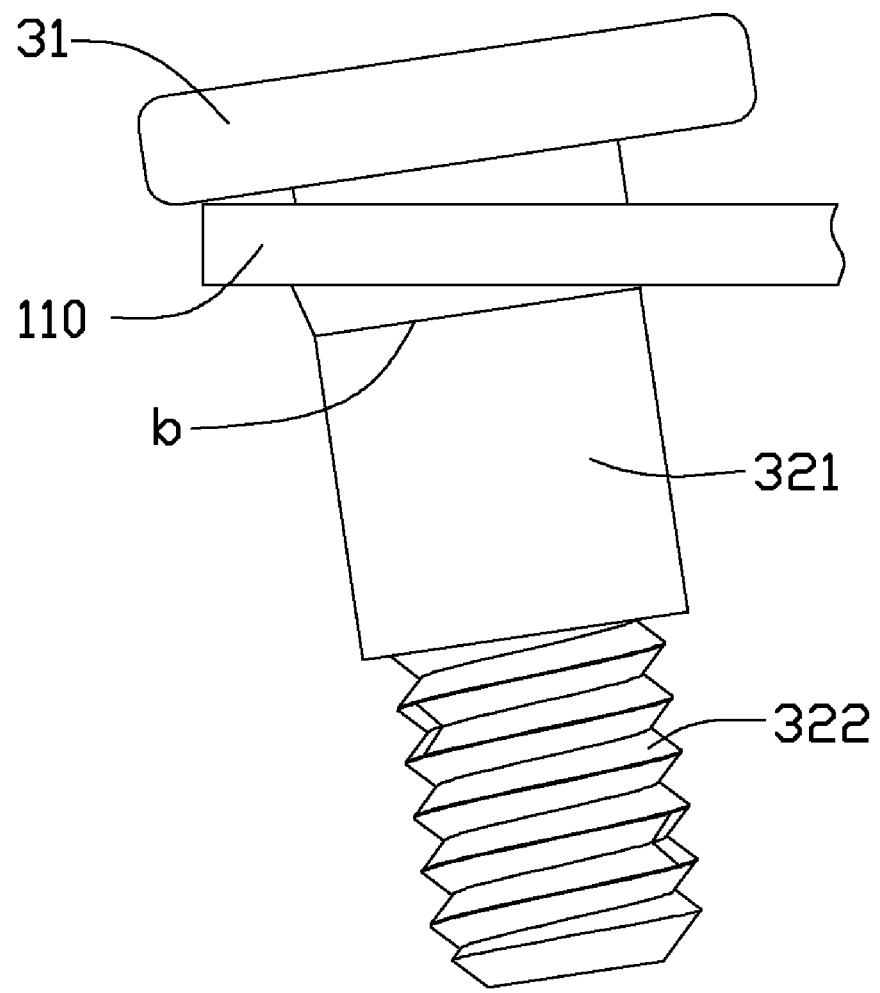
Figure 7:
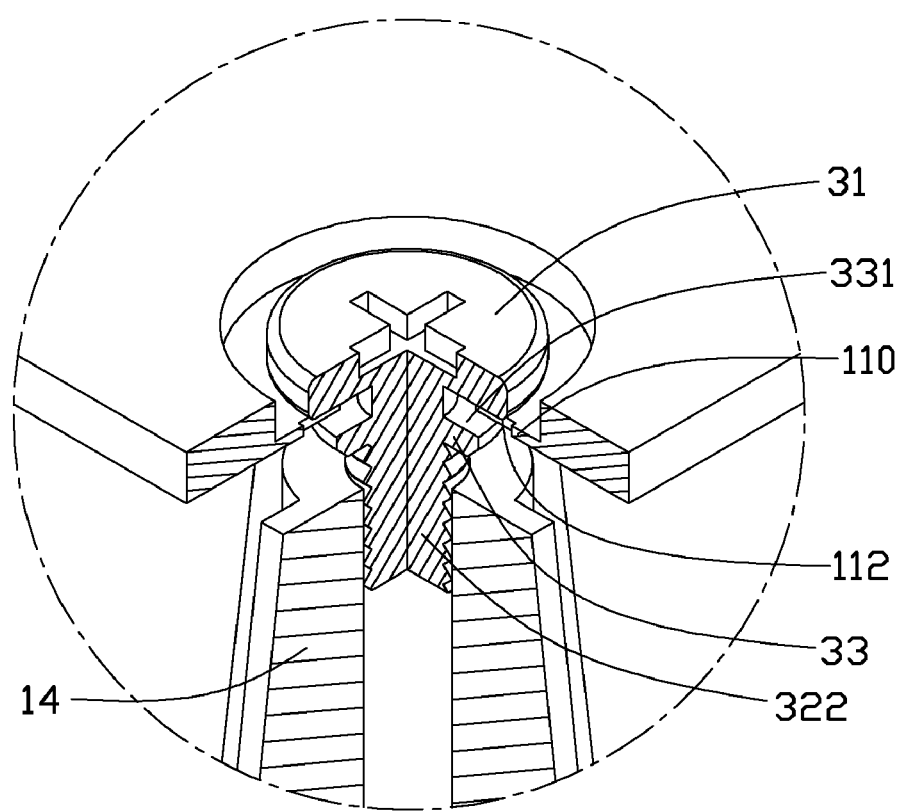
FIG. 7 is an enlarged, cutaway view of a circled portion VII of FIG. 1.
Figure 8:
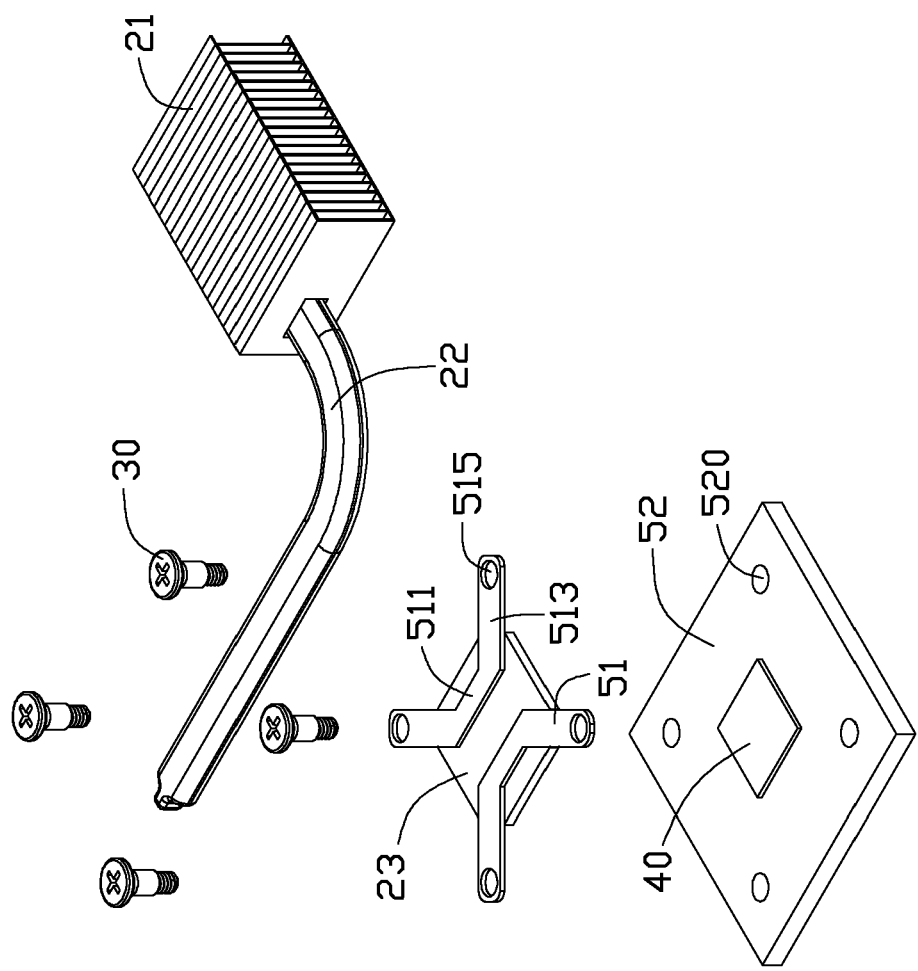
FIG. 8 is an exploded view of a heat dissipation device of the electronic device of FIG. 2.

Referring to FIG. 6, the head 31 of the fastener 30 is pressed down to overcome friction between the side surface 334 and an inner surface of the top wall 11 around the mounting hole 112, and the pressing is continued until the protruding flange 33 passes through the mounting hole 112. Finally, the fastener 30 is oriented vertically, with the shaft portion 321 coaxial with the central axis of the mounting hole 112 again. In this state, the fastener 30 cannot easily move back out of the mounting hole 112 when the fastener 30 is subjected to, for example, vibration. This is because the fastener 30 is held in place at the neck 35, with the protruding flange 33 preventing unwanted escape of the fastener 30.

The predetermined angle θ can be obtained by the following equation:

$$\theta = \arcTan\left(\frac{2(H \pm \delta 3)}{D \pm \delta 1 + d \pm \delta 2}\right),$$

wherein D is the largest outer diameter of the protruding flange 33, d is the smallest outer diameter of the protruding flange 33, H is a height of the protruding flange 33, and δ1, δ2, and δ3 are manufacturing tolerances of the largest outer diameter D, the smallest outer diameter d and the height H of protruding flange 33, respectively. For ensuring the fastener 30 to be successfully assembled in the mounting hole 112, the largest dimension of the protruding flange 33 when the fastener is inclined at the predetermined angle θ with respect to the central axis of the mounting hole 112 must be equal to or slightly larger than the diameter of the mounting hole 112. Thus, when designing such a fastener 30, the largest dimension of the protruding flange 33 along a plane parallel to the radial directions of the mounting hole 112 can be firstly calculated by actually inclining a model of the fastener 33 in a mounting hole 112 at a desired predetermined angle θ. In this way, the proper largest dimension according to the desired predetermined angle θ can be determined.

In assembly of the casing 13, the fastener 30 is firstly assembled to the top wall 11 of the casing 13, following the process described above and shown in FIGS. 4-6. Then, the top wall 11 is positioned above the bottom wall 12 so that the fastener 30 can be screwed into the fixing pole 14, thereby fixedly connecting the top and bottom walls 11, 12 together.

The heat dissipation device 20 includes a heat sink 21, a heat pipe 22, and a heat absorbing plate 23. The heat absorbing plate 23 is attached to an electronic component 40 for absorbing heat generated therefrom. The heat pipe 22 is interconnected between the heat sink 21 and the heat absorbing plate 23, with one end of the heat pipe 22 thermally contacting a top surface of the heat absorbing plate 23 and another end of the heat pipe 22 thermally contacting the heat sink 21. The heat pipe 22 is configured for transferring heat from the heat absorbing plate 23 to the heat sink 21. The heat sink 21 is for dissipating heat into the ambient environment rapidly.

The fixing device 50 is for mounting the heat absorbing plate 23 on the electronic component 40. The fixing device 50 includes a supporting plate 52, and two elastic members 51. The supporting plate 52 is for supporting the electronic component 40 thereon. The elastic members 51 are located at two opposite sides of the top surface of the heat absorbing plate 23, respectively. Each of the elastic members 51 includes a connecting strip 511, and two securing arms 513 extending outwardly and slantwise from two opposite ends of the connecting strip 511, respectively. Each of the securing arms 513 defines a securing hole 515 at a distal end thereof. A plurality of screw holes 520 corresponding to the securing holes 515 is defined in the supporting plate 52.

A plurality of fasteners 30 is provided to connect the elastic members 51 to the supporting plate 52. The fasteners 30 are firstly assembled to the securing arms 513, following much the same process as described above and shown in FIGS. 4-6. When assembling the heat dissipation device 20 to the electronic component 40, the connecting strips 511 of the elastic members 51 are soldered to the heat absorbing plate 23. Then the fasteners 30 are respectively screwed into the screw holes 520 of the supporting plate 52. Thereby, the heat absorbing plate 23 is held in tight contact with the electronic component 40.

The fasteners 30 are self-locking, easily applied, and have a simple structure and accordingly a low cost. The above-described rings of the conventional art are not needed for the fastener 30 and fixing device 50, and assembly of such rings to the fastener 30 is not needed. Accordingly, the fastener 30 and fixing device 50 do not have the above-described disadvantages of the conventional art. Moreover, the configuration of the fastener 30 can limit axial movement of the fastener 30 relative to the piece to which the fastener 30 is mounted. The fastener 30 is thereby securely held in the mounted piece, and does not easily work loose, even during transportation.

Figure 9:
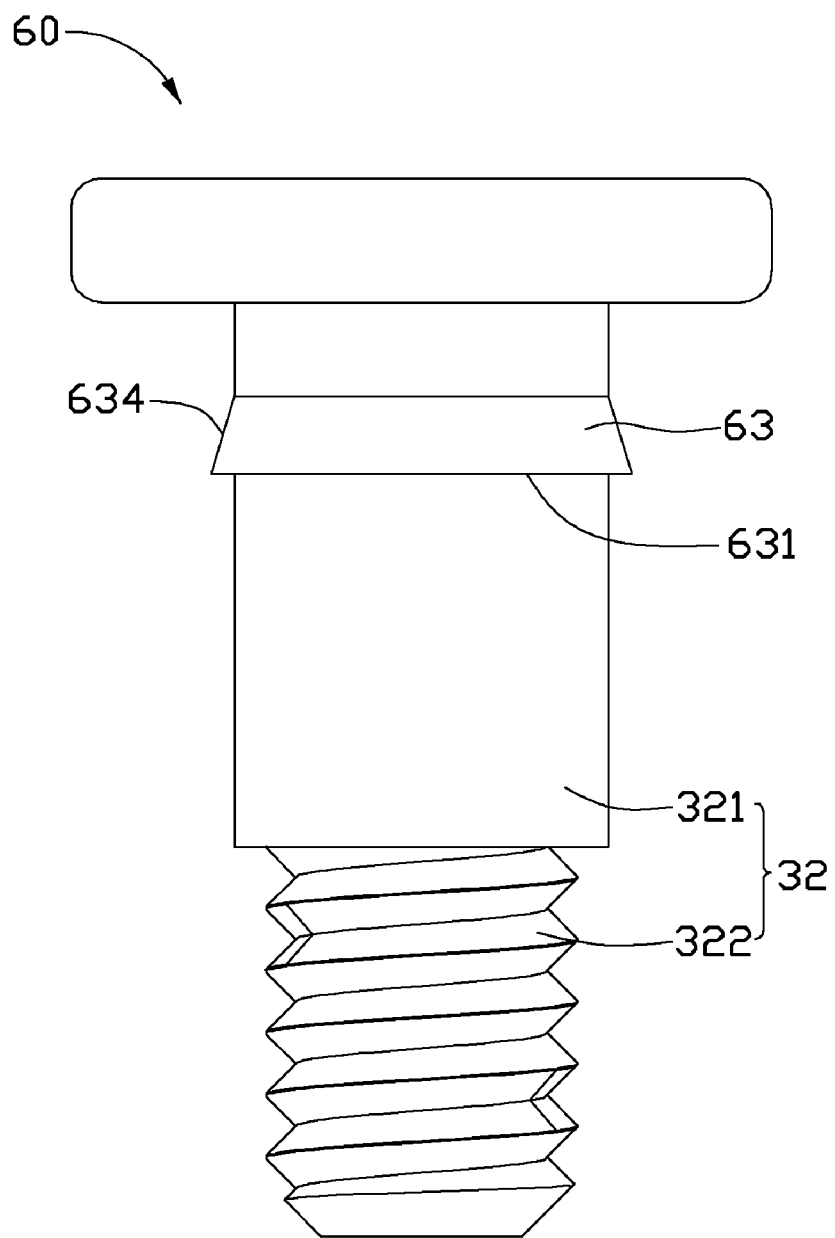
FIG. 9 is a front plan view of a fastener according to an alternative embodiment of the present disclosure.

FIG. 9 shows a fastener 60 according to an alternative embodiment. The fastener 60 differs from the fastener 30 of the previous embodiment only in a shape (or orientation) of a protruding flange 63 thereof. The protruding flange 63 includes an annular bottom surface 631 extending radially and perpendicularly from the outer surface of the shaft portion 321, and a tapered annular side surface 634 extending upwardly and slantwise from an outer periphery of the bottom surface 631 to connect with the outer surface of the shaft portion 321. The outer diameter of the protruding flange 63 gradually decreases along an axial direction of the shank 32 from one end of the shank 32 adjacent to the engaging portion 322 to the other end of the shank 32 adjacent to the head 31. When the fastener 60 is oriented vertically and viewed side-on, a projection of the protruding flange 63 is an isosceles trapezoid. The isosceles trapezoid of the fastener 60 is much the same as the isosceles trapezoid of the projection of the protruding flange 33 of the fastener 30 of the previous embodiment. The only difference is that the isosceles trapezoid of the fastener 60 is inverted compared to the isosceles trapezoid of the fastener 30.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fixing device, comprising:
a mounted piece defining a mounting hole therein; and
a fastener configured for engaging with the mounting piece, the fastener comprising:
a head;
a shank extending downwardly from a bottom of the head; and
a protruding flange extending outwardly from an outer surface of the shank at a position adjacent to the head, an outer diameter of the protruding flange varying along an axial direction of the shank, a portion of the shank between the head and the protruding flange defining a neck;
wherein when the fastener is oriented such that the shank is coaxial with a central axis of the mounting hole, the protruding flange is too large to pass through the mounting hole; and when the fastener is oriented at a predetermined inclined angle with respect to the central axis of the mounting hole, the protruding flange can pass through the mounting hole whereupon the mounted piece surrounds the neck; and
wherein when the fastener is oriented with the shank coaxial with the central axis of the mounting hole and the fastener is viewed side-on, a projection of the protruding flange is an isosceles trapezoid.

2. The fixing device of claim 1, wherein the predetermined inclined angle is defined as $\theta$, and is obtained by the following equation:

$$\theta = \mathrm{arcTan}\left(\frac{2(H \pm \delta 3)}{D \pm \delta 1 + d \pm \delta 2}\right),$$

wherein D is a largest diameter of the protruding flange, d is a smallest diameter of the protruding flange, H is a height of the protruding flange, and $\delta 1$, $\delta 2$, and $\delta 3$ are manufacturing tolerances of the largest outer diameter, the smallest outer diameter and the height of protruding flange, respectively.

3. The fixing device of claim 1, wherein the protruding flange comprises an annular top surface and a tapered side surface extending downwardly and slantwise from an outer periphery of the top surface to connect with the outer surface of the shank, the outer diameter of the protruding flange gradually decreasing from one end that is adjacent to the head, a largest outer diameter of the protruding flange located at a junction between the top surface and the side surface.

4. The fixing device of claim 1, wherein the protruding flange comprises an annular bottom surface and a tapered side surface extending upwardly and slantwise from an outer periphery of the bottom surface to connected with the outer surface of the shank, the outer diameter of the protruding flange gradually decreasing from one end that is farthest away from the head, a largest outer diameter of the protruding flange located at a junction between the bottom surface and the side surface.

5. An electronic device, comprising:
a bottom wall comprising a fixing pole extending upwardly therefrom;
a top wall defining a mounting hole corresponding to the fixing pole; and
a fastener configured for extending through the mounting hole of the top wall and being engaged in the fixing pole to thereby connect the top and bottom walls together, the fastener comprising:
a head;
a shank extending downwardly from a bottom of the head; and
a protruding flange extending outwardly from an outer surface of the shank at a position adjacent to the head, a portion of the shank between the head and the protruding flange forming a neck, an outer diameter of the protruding flange varying along an axial direction of the shank;
wherein when the fastener is oriented such that the shank is coaxial with a central axis of the mounting hole, the protruding flange is too large to pass through the mounting hole; and when the fastener is oriented at a inclined predetermined angle respect to the central axis of the mounting hole, the protruding flange can pass through the mounting hole whereupon the top wall surrounds the neck; and
wherein the top wall comprises a plurality of splits extending radially from a periphery of the mounting hole, each of the splits communicating with the mounting hole.

6. The electronic device of claim 5, wherein the protruding flange comprises an annular top surface and a tapered side surface extending downwardly and slantwise from an outer periphery of the top surface to connect with the outer surface of the shank, the outer diameter of the protruding flange gradually decreasing from one end that is adjacent to the head, a largest outer diameter of the protruding flange located at a junction between the top surface and the side surface.

7. The electronic device of claim 5, wherein the protruding flange comprises an annular bottom surface and a tapered side surface extending upwardly and slantwise from an outer periphery of the bottom surface to connected with the outer surface of the shank, the outer diameter of the protruding flange gradually decreasing from one end that is farthest away from the head, a largest outer diameter of the protruding flange located at a junction between the bottom surface and the side surface.

8. A fixing device, comprising:
a mounted piece defining a mounting hole therein; and
a fastener configured for engaging with the mounting piece, the fastener comprising:
a head;
a shank extending downwardly from a bottom of the head; and
a protruding flange extending outwardly from an outer surface of the shank at a position adjacent to the head, an outer diameter of the protruding flange varying along an axial direction of the shank, a portion of the shank between the head and the protruding flange defining a neck;
wherein when the fastener is oriented such that the shank is coaxial with a central axis of the mounting hole, the protruding flange is too large to pass through the mounting hole; and when the fastener is oriented at a predetermined inclined angle with respect to the central axis of the mounting hole, the protruding flange can pass through the mounting hole whereupon the mounted piece surrounds the neck; and
wherein the protruding flange comprises an annular bottom surface and a tapered side surface extending upwardly and slantwise from an outer periphery of the bottom surface to connected with the outer surface of the shank, the outer diameter of the protruding flange gradually decreasing from one end that is farthest away from the head, a largest outer diameter of the protruding flange located at a junction between the bottom surface and the side surface.

9. The fixing device of claim 8, wherein the predetermined inclined angle is defined as $\theta$, and is obtained by the following equation:

$$\theta = \mathrm{arcTan}\left(\frac{2(H \pm \delta 3)}{D \pm \delta 1 + d \pm \delta 2}\right),$$

wherein D is a largest diameter of the protruding flange, d is a smallest diameter of the protruding flange, H is a height of the protruding flange, and $\delta 1$, $\delta 2$, and $\delta 3$ are manufacturing tolerances of the largest outer diameter, the smallest outer diameter and the height of protruding flange, respectively.

* * * * *